United States Patent
Zhang et al.

(10) Patent No.: US 10,255,983 B2
(45) Date of Patent: Apr. 9, 2019

(54) SHIFT REGISTER, UNIT THEREOF, AND DISPLAY DEVICE

(71) Applicant: Peking University Shenzhen Graduate School, Guangdong (CN)

(72) Inventors: Shengdong Zhang, Guangdong (CN); Zhijin Hu, Guangdong (CN); Congwei Liao, Guangdong (CN); Wenjie Li, Guangdong (CN); Junmei Li, Guangdong (CN); Shijie Cao, Guangdong (CN)

(73) Assignee: Peking University Shenzhen Graduate, Guangdong (CN)

( * ) Notice: Subject to any disclaimer, the term of this patent is extended or adjusted under 35 U.S.C. 154(b) by 0 days.

(21) Appl. No.: 15/566,608

(22) PCT Filed: Mar. 25, 2016

(86) PCT No.: PCT/CN2016/077395
§ 371 (c)(1),
(2) Date: Oct. 16, 2017

(87) PCT Pub. No.: WO2016/165546
PCT Pub. Date: Oct. 20, 2016

(65) Prior Publication Data
US 2018/0144810 A1    May 24, 2018

(30) Foreign Application Priority Data
Apr. 14, 2015   (CN) .......................... 2015 1 0175217

(51) Int. Cl.
G11C 19/00      (2006.01)
G11C 19/28      (2006.01)
(Continued)

(52) U.S. Cl.
CPC ............... *G11C 19/28* (2013.01); *G09G 3/20* (2013.01); *G09G 3/2092* (2013.01);
(Continued)

(58) Field of Classification Search
None
See application file for complete search history.

(56) References Cited

U.S. PATENT DOCUMENTS

2014/0085258 A1 *  3/2014  Beraud .................. B60K 37/00
                                                            345/174
2014/0091996 A1 *  4/2014  Moon .................. G09G 3/3685
                                                             345/92
(Continued)

FOREIGN PATENT DOCUMENTS

CN      101540188 A      9/2009
CN      104318883 A      1/2015

OTHER PUBLICATIONS

CN Office Action dated Nov. 30, 2016, from China Patent Application No. CN2015101752170, 4 pages.
(Continued)

*Primary Examiner* — Tuan T Lam
(74) *Attorney, Agent, or Firm* — Lee & Hayes, P.C.

(57) ABSTRACT

The present application discloses a shift register and units thereof, wherein low voltage level maintaining module (30) includes: a first maintaining unit (31) and a second maintaining unit (32), configured to maintain a signal output terminal and/or the controlling terminal (Q) of the driving module (20) at low voltage level when an effective level is received. A threshold voltage sensing module (40) is coupled between the first maintaining unit (31) and the second maintaining unit (32), the threshold voltage sensing module (40) is configured to control its signal output terminal to provide an effective level to the second maintain-enabling terminal (P2) according to threshold voltage shift (Continued)

of the first maintaining unit (31) sensed. Therefore, low voltage maintaining module (30) may endure a greater threshold voltage shift, and the life span of the circuit is extended. The present application further discloses a display device and a voltage regulating circuit.

9 Claims, 6 Drawing Sheets

(51) Int. Cl.
*G09G 3/20* (2006.01)
*G09G 3/36* (2006.01)

(52) U.S. Cl.
CPC ......... *G09G 3/3648* (2013.01); *G09G 3/3674* (2013.01); *G09G 3/3677* (2013.01); *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 2014/0091997 A1* | 4/2014 | Han | G09G 3/3677 345/92 |
| 2017/0097650 A1* | 4/2017 | Zhang | G09G 3/20 |
| 2017/0116925 A1* | 4/2017 | Lee | G09G 3/3225 |
| 2017/0213500 A1* | 7/2017 | Zhang | G09G 3/36 |
| 2017/0294166 A1* | 10/2017 | Kim | G09G 3/3266 |
| 2018/0130415 A1* | 5/2018 | Zhang | G09G 3/20 |
| 2018/0138256 A1* | 5/2018 | Han | G09G 3/20 |

OTHER PUBLICATIONS

PCT Search Report and Written Opinion dated Jun. 29, 2016, International Application No. PCT/CN2016/077395, filed Mar. 25, 2016, 7 pages.

\* cited by examiner

SHIFT REGISTER, UNIT THEREOF, AND DISPLAY DEVICE

CROSS REFERENCE TO RELATED APPLICATIONS

This application is a 35 USC § 371 filing of International Application No. PCT/CN2016/077395, filed Mar. 25, 2016, entitled SHIFT REGISTER, UNIT THEREOF, AND DISPLAY DEVICE, which claims the benefit of China Patent Application No. CN2015101752170, filed Apr. 14, 2015, entitled SHIFT REGISTER, UNIT THEREOF, AND DISPLAY DEVICE, which are incorporated herein by reference.

TECHNICAL FIELD

Aspects of the present disclosure relate to the field of electronic circuits, and more particularly, to voltage regulating circuits, shift registers and units thereof, as well as display devices.

BACKGROUND

In the recent years, the driving circuit of integrated display is becoming a hotspot in research of flat panel display. Driving circuits of integrated display refer to integrating peripheral circuits including gate driving circuits and data driving circuits which are in form of thin film transistors (TFT), disposed onto display panels where TFT pixels are located, so that the number of peripheral driving ICs, the packaging process, and the manufacturing cost are reduced. In addition, peripheries of the displays are slimmed down, modules of the displayer can be arranged in a more compact manner, and mechanical and electrical reliabilities are enhanced.

In driving circuits of displays, shift register units are important cell modules of gate driving circuits. In designs of shift register units, low voltage maintaining circuits are usually needed to guarantee that signal output terminals connected to row scanning line would not be in floating state, and to eliminate low voltage noise due to clock feedthrough and capacitive coupling. However, in low voltage maintaining circuits, transistors for maintaining low voltage are subject to threshold voltage shift due to long time voltage pressure. Such degradation of transistors may lead to failure of circuits after long time of work. Threshold voltage shift of low voltage maintaining transistors may be more severe for those shift register units which are based on technical solutions with amorphous silicon, which may influence the life span of the circuits.

In order to ensure good liability of shift register units, in present solutions, lowing of voltage pressures, bias of impulse voltages, reduction of duty cycles, and other means are applied to reduce the amount of threshold voltage shift of the low voltage maintaining transistors, and to extend the life span of circuits. In middle and large size panel displays, driving circuits have to work for extended hours, which is more challenging to the life span of circuits. Thus, it is a topic worthwhile for further research regarding how to efficiently increase circuit working time and increase life span of shift registers.

SUMMARY

The present application provides a voltage regulating circuit, a shift register and units thereof, and a display device, to turn on a following maintaining unit according to the threshold voltage shift situation of the previous maintaining unit, in order to extend working time of the circuit.

In one aspect, the present application provides a shift register, including at least one shift register unit, wherein the shift register unit includes a driving module configured to transmit a first clock signal to a signal output terminal of the shift register unit by switching on/off state of a controlling terminal, to output a scanning signal; an inputting module configured to control the on/off state of the controlling terminal of the driving module; a low voltage level maintaining module, including a first maintaining unit configured to maintain a signal output terminal and/or the controlling terminal of the driving module at low voltage level when a first maintain-enabling terminal receives an effective level; a second maintaining unit configured to maintain the signal output terminal and/or the controlling terminal of the driving module at low voltage level when a second maintain-enabling terminal receives an effective level; wherein the shift register unit further includes threshold voltage sensing module, with a sensing input terminal coupled to the first maintain-enabling terminal, a signal output terminal coupled to the second maintain-enabling terminal, configured to control its signal output terminal to provide an effective level to the second maintain-enabling terminal according to shifted threshold voltage sensed at its sensing input terminal.

In a second aspect, the present application provides a display device, including a two dimensional pixel array that includes a plurality of pixels, and a plurality of data lines along a first direction and a plurality of gate scanning lines along a second direction coupled to each of the pixels in the pixel array; a data driving circuit configured to provide data signals to the data lines; a gate driving circuit configured to provide gate driving signals to the gate scanning lines; wherein the gate driving circuit includes the shift register as described above.

In a third aspect, the present application provides a voltage regulating circuit, configured to regulate a supply voltage outputted to a second apparatus circuit according to threshold voltage information of a first apparatus circuit, wherein the voltage regulating circuit includes a coupling capacitor and a sensing transistor; a control electrode the sensing transistor is a sensing terminal of the voltage regulating circuit configured to sense threshold voltage shift of transistors to be sensed in the first apparatus circuit, a second electrode of the sensing transistor is coupled to low voltage supply, a first electrode of the sensing transistor is a signal output terminal of the voltage regulating circuit configured to provide the supply voltage to the second apparatus circuit; the coupling capacitor has a first side coupled to input clock signal, and a second side coupled to the first electrode of the sensing transistor; the sensing transistor is configured to regulate the supply voltage outputted to the second apparatus circuit according to threshold voltage shift sensed.

The shift register as described above is configured to sense the threshold voltage shift at the first maintain-enabling terminal through the threshold voltage sensing module, and to regulate the supply voltage provided to the second apparatus circuit according to the threshold voltage shift sensed. Therefore, the low voltage maintaining module may endure greater threshold voltage shift, and the life span of the circuit may be extended.

In the voltage regulating circuit described above, the sensing transistor is configured to adjust its turning-on status according to the sensed threshold voltage shift of the first apparatus circuit, and to regulate the supply voltage provided to the second apparatus circuit accordingly, to improve the collaborative working mode of the first and second apparatus circuits.

DETAILED DESCRIPTION

The present application is explained in detail below according to the embodiments in connection with the appended drawings.

The terminologies used herein are explained.

The transistors in this application may be bipolar transistors or field effect transistors. When the transistor is a bipolar transistor, the control electrode is the base of the bipolar transistor, the first electrode is the collector or the emitter of the bipolar transistor, and correspondingly, the second electrode is the emitter or the collector of the bipolar transistor. When the transistor is a field effect transistor, the control electrode is the gate of the field effect transistor, the first electrode is the drain or the source of the field effect transistor, and correspondingly, the second is the source or the drain of the field effect transistor. The transistors in display devices are usually a kind of field effect transistors: thin film transistors (TFTs). The circuit is explained by taking the transistors as field effect transistor in the following. Of course, in other embodiments, the transistors can be bipolar transistors.

Embodiment I

Figure 1:
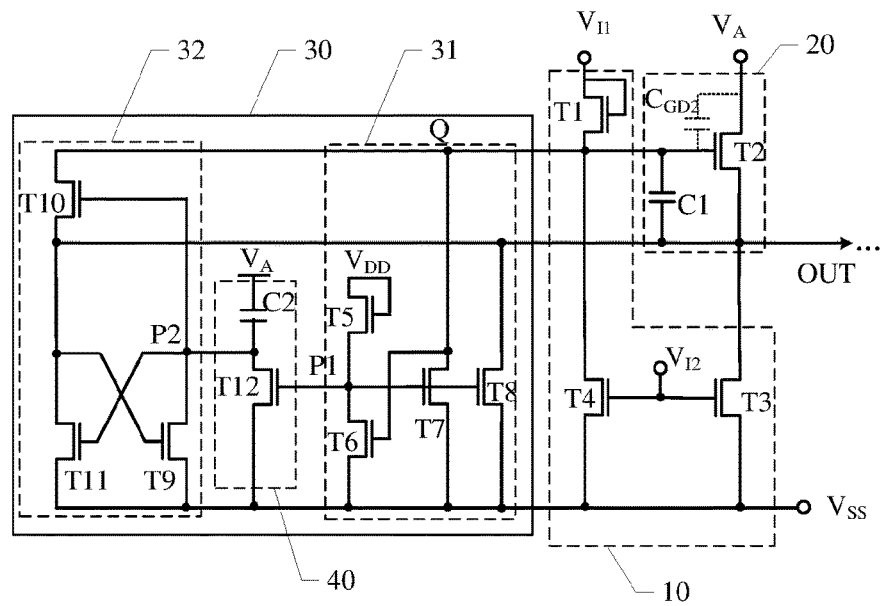
FIG. 1 illustrates a circuit structure diagram of a shift register unit according to a first embodiment of the present application.

FIG. 1 illustrates a circuit structure diagram of a shift register unit according to one embodiment of the present application. The shift register unit includes: a driving module 20, an inputting module 10, a low voltage maintaining module 30, and a threshold voltage sensing module 40.

Driving module 20 is configured to transmit a first clock signal $V_A$ to a signal output terminal OUT of the shift register unit by switching on/off state of its controlling terminal Q so as to output a scanning signal. In one embodiment, the on/off state of the controlling terminal Q may be represented by high/low voltage level. For example, high voltage level may represent the controlling terminal Q is on whereas low voltage level may represent that the controlling terminal Q is off. In another embodiment, the on/off state may be set according to categories of transistors. In a specific embodiment, the driving module may include: a second transistor T2 and a first capacitor C1, wherein a control electrode of the second transistor T2 is coupled to a first side of capacitor C1 to form a controlling terminal Q of driving module 20; a second electrode of the second transistor T2 is coupled to a second side of capacitor C1 to form the signal output terminal of the shift register unit; a first electrode of the second transistor T2 is configured to receive the first clock signal $V_A$. In other embodiment, current available or future available driving means may be adopted.

Inputting module 10 is configured to control the switching of on/off state of the controlling terminal Q of driving module 20. In one embodiment, inputting module includes: a first transistor T1, a third transistor T3, and a fourth transistor T4, wherein a control electrode of the first transistor T1 is coupled to its first electrode, for inputting of a first pulse signal $V_{I1}$; a second electrode of the first transistor T1 is coupled to the controlling terminal Q of driving module 20. Control electrodes of the fourth transistor T4 and the third transistor T3 are configured to receive a second pulse signal $V_{I2}$; a first electrode of the fourth transistor T4 is coupled to the controlling terminal Q of driving module 20; a second electrode of the fourth transistor T4 is coupled to low voltage supply. A first electrode of the third transistor T3 is coupled to the signal output terminal of the shift register unit, and a second electrode of the third transistor T3 is coupled to the low voltage supply. In other embodiment, there may be other currently or future available ways of inputting. In the present embodiment, the effective level of the first pulse signal $V_{I1}$ precedes that of the first clock signal $V_A$ by half of the clock cycle, and the effective level of the first clock signal $V_A$ precedes that of the second pulse signal $V_{I2}$ by half of the clock cycle. One thing to be noted is that, when the transistors are N-type, the turning-one effective level for the control electrode is high voltage level whereas when the transistors are P-type the turning-one effective level for the control electrode is low voltage level. In the present embodiment, the transistors are N-type therefore the turning-on effective level for the transistors is high voltage level.

Low voltage maintaining module 30 may include: a first maintaining unit 31 configured to maintain the signal output terminal and/or the controlling terminal Q of driving module 20 at low voltage level when a first maintain-enabling terminal P1 receives an effective level; a second maintaining unit 32 configured to maintain the signal output terminal and/or the controlling terminal Q of driving module 20 at low voltage level when a second maintain-enabling terminal P2 receives an effective level.

In a specific embodiment, for example, the first maintaining unit 31 may include: a fifth transistor T5, a sixth transistor T6, a seventh transistor T7, and an eighth transistor T8. A control electrode of the fifth transistor T5 is coupled to its first electrode for coupling to high voltage supply, and a second electrode of the fifth transistor T5 is coupled to a first electrode of the sixth transistor T6. A control electrode of the sixth transistor T6 is coupled to a first electrode of the seventh transistor T7, and a second electrode of the sixth transistor T6 is coupled to the low voltage supply $V_{SS}$. The first electrode of the seventh transistor T7 is coupled to the controlling terminal Q of driving module 20, a control electrode of the seventh transistor T7 is coupled to the first electrode of the sixth transistor T6, a control electrode of the seventh transistor T7 is the first maintain-enabling terminal P1, and a second electrode of the seventh transistor T7 is coupled to the low voltage supply $V_{SS}$. A first electrode of the eighth transistor T8 is coupled to the signal output terminal of the shift register unit, a control electrode of the eighth transistor T8 is coupled to the control electrode of the seventh transistor T7, and a second electrode of the eighth transistor T8 is coupled to the low voltage supply $V_{SS}$. In other embodiment, there may be other current or future available way of voltage maintaining.

In a specific embodiment, the second maintaining unit 32 may include: a ninth transistor T9, a tenth transistor T10 and an eleventh transistor T11. A control electrode of the ninth transistor T9 is coupled to a second electrode of the tenth transistor T10, a first electrode of the ninth transistor T9 is coupled to a control electrode of the tenth transistor T10, a second electrode of the ninth transistor T9 is coupled to the low voltage supply $V_{SS}$. A first electrode of the tenth transistor T10 is coupled to the controlling terminal Q of driving module 20, a second electrode of the tenth transistor T10 is coupled to a first electrode of the eleventh transistor T11, and a control electrode of the tenth transistor T10 is the second maintain-enabling terminal P2. A control electrode of the eleventh transistor T11 is coupled to the control electrode of the tenth transistor T10, a first electrode of the eleventh transistor T11 is coupled to the signal output terminal of the shift register unit, a second electrode of the eleventh transistor T11 is coupled to the low voltage supply $V_{SS}$. In other embodiment, there may be other current or future available way of voltage maintaining. In other embodiments, the first maintaining unit 31 and the second maintaining unit 32 may have the same circuit structure.

It is to be noted that the above-mentioned modules are theoretically explained in way of examples with regards to shift register units. All modules could be achieved with currently available solutions. Therefore, the modules are not introduced in great detail. People of ordinary skills would be able to realize the connections based on currently available solutions.

Threshold voltage sensing module 40 has a sensing input terminal coupled to the first maintain-enabling terminal P1, and a signal output terminal coupled the second maintain-enabling terminal P2. The threshold voltage sensing module 40 is configured to control its signal output terminal based on the shift of threshold voltage sensed at the sensing input terminal to provide an effective level to the second maintain-enabling terminal P2. In the present embodiment, threshold voltage sensing module 40 is coupled between the first maintaining unit 31 and the second maintaining unit 32. Therefore, even if threshold voltage shift of the transistor(s) corresponding to the first maintain-enabling terminal P1 in the first maintaining unit 31 is overly great, under the sensing and controlling of threshold voltage sensing module 40, effective voltage level could be provided from the signal output terminal of threshold voltage sensing module 40 to the second maintain-enabling terminal P2, so that the second maintaining unit 32 may be activated, so as to ensure low voltage maintaining for the shift register unit.

In order for easy understanding, with respect to FIG. 1, in specific embodiments, threshold voltage sensing module 40 includes: a twelfth transistor T12 and a second capacitor C2. A control electrode of the twelfth transistor T12 is the sensing terminal of threshold voltage sensing module 40, a second electrode of the twelfth transistor T12 is coupled to the low voltage supply $V_{SS}$, a first electrode of the twelfth transistor T12 is coupled to a first side of the second capacitor to form the signal output terminal of threshold voltage sending module 40, and a second side of the second capacitor is configured to receive the first clock signal $V_A$.

Figure 2:
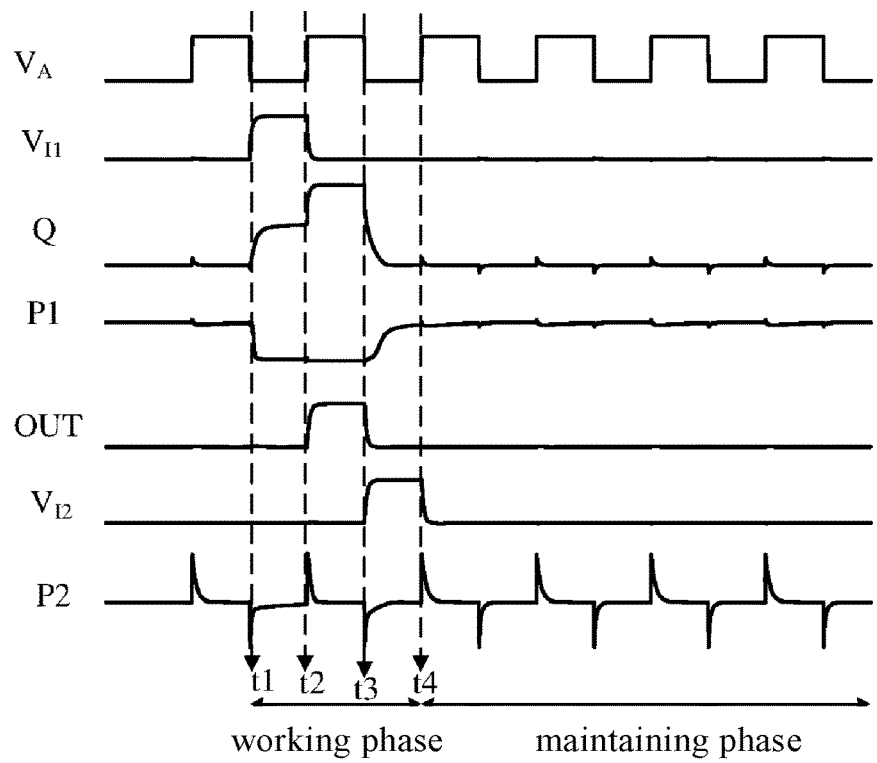
FIG. 2 illustrates a sequence diagram of the shift register unit according to the first embodiment of the present application.

FIG. 2 is a sequence diagram of the shift register unit of the present embodiment. In this embodiment, the sequences of input signals are as follow: the high level of the first pulse signal $V_{f1}$ is half clock cycle ahead of that of the first clock signal $V_A$, the high level of the second pulse signal $V_{f2}$ is half clock cycle behind that of the first clock signal $V_A$. For the purpose of description, in the present embodiment, $V_H$ represents high (voltage) level of the various clock signals or pulse signals, and $V_L$ represents low (voltage) level of the various clock signals or pulse signals. In the present embodiment, the working process of the shift register unit may include two stages: working phase and low voltage maintaining phase. Detailed explanation about the working process of the shift register unit is provided in the following in view of FIGS. 1 and 2.

In the working phase, the shift register unit of the current stage is selected to be turned on to complete the pulling up and pulling down processes of the output signal $V_{OUT}$ at the output terminal OUT of the shift register unit of the current stage. Such a phase is defined as the working phase of the shift register unit.

At t1, the first clock signal $V_A$ and the second pulse signal $V_{f2}$ are at low voltage level $V_L$, the first pulse signal $V_{f1}$ rises to high voltage level $V_H$ from low voltage, at the same time the first transistor T1 and the second transistor T2 are turned on. The first pulse signal is configured to charge the controlling terminal Q via the turned-on first transistor T1. When the voltage at the controlling terminal Q rises to $V_H$-$V_{TH1}$, the first transistor is turned off, wherein $V_{TH1}$ the threshold voltage of the first transistor T1. During this period, the output terminal OUT is discharged to the low voltage level $V_L$ via the turned-on second transistor T2.

At t2, charging of the controlling terminal Q is completed. At t2, the second pulse signal $V_{f2}$ maintains at low voltage level, the first pulse signal $V_{f1}$ also drops to low voltage level, and the first clock signal $V_A$ rises up to high voltage level from low voltage level. The first, the third, and the fourth transistors are turned off. Therefore, the controlling terminal Q is floating. The first clock signal $V_A$ is configured to charge the signal output terminal via the turned-on second transistor T2, and the voltage at the controlling terminal Q also rises rapidly as the voltage at the output terminal rises. Such a phenomenon is called self-boosting. The rise of the voltage at controlling terminal Q expedites the charging speed of the signal output terminal OUT, therefore the voltage at the signal output terminal OUT may rise to high voltage level $V_H$ rapidly.

At t3, the first clock signal $V_A$ drops from high voltage level to low voltage level, the second pulse signal $V_{f2}$ rises to high voltage level from low. The third and the fourth transistors T3 and T4 are turned on, therefore the voltages at the signal output terminal OUT and the controlling terminal Q are pulled down to $V_L$. During this period, before the voltage at the controlling terminal Q drops to the threshold voltage $V_{TH2}$ of the second transistor T2, the second transistor T2 is still on which may act as an assistive path for discharging the signal output terminal. Therefore, the output signal $V_{OUT}$ is pulled down to $V_L$ rapidly.

It is to be noted that, when the voltage at the controlling terminal Q is at high voltage level, the sixth transistor T6 is turned on and is configured to pull the voltage at the first maintain-enabling terminal P1 down to low voltage level which may render the seventh transistor T7 and the eighth transistor T8 at off state, so that the self-boosting process of the controlling terminal Q and the charging of the signal output terminal OUT are not affected.

As such, a high voltage pulse of the first clock signal $V_A$ is completely transmitted to the signal output terminal OUT by the shift register unit and the working phase of the shift register unit finishes.

In the low voltage maintaining phase, after the voltage at the signal output terminal OUT is pulled down to low voltage level $V_L$, shift register of the current stage is selected to be turned off. The voltage at the signal output terminal OUT must be maintained at low voltage level $V_L$ to avoid erroneous turning-on of switching transistors in pixels of a display device coupled to the signal output terminal which may render erroneous writing of image information. This phase is defined as the low voltage maintaining phase.

After the working phase finishes, the first pulse signal $V_{I1}$ and the second pulse signal $V_{I2}$ are at low voltage level, and the voltage at the controlling terminal Q is also at low voltage level. Therefore, the first and second transistors T1 and T2 are turned off, the voltage at the signal output terminal OUT should also be maintained at low voltage level $V_L$. Due to the large parasitic capacitance $C_{GD2}$ between the control electrode (for example gate) and the first electrode (for example drain) of the second transistor T2, when the first clock signal $V_A$ transits from low voltage level $V_L$ to high voltage level $V_H$, the voltage at the controlling terminal may rise as well. This is called clock feedthrough. When the voltage at the controlling terminal Q rises to be greater than the threshold voltage of the second transistor T2, the second transistor T2 may be turned on, the signal output terminal may be charged unexpectedly by the first clock signal $V_A$ via the second transistor T2, producing a large noise voltage at the signal output terminal. Besides, in actual display devices, parasitic capacitance coupling effects exist between signal lines on the panels, which may also cause noise voltage at the signal output terminal of the shift register unit. Therefore, when the shift register unit is not selected to be turned on, certain measures have to be taken to guarantee the output signal $V_{OUT}$ at the signal output terminal is at low voltage level $V_L$.

In the present embodiment, low voltage maintaining module 30 is configured to suppress clock feedthrough effect and to eliminate noise voltage at the signal output terminal OUT. In low voltage maintaining phase, firstly the first maintaining unit 31 starts to work and to maintain the voltages at the controlling terminal Q and the signal output terminal OUT at the low voltage level. Specifically, when the voltage at the controlling terminal Q is drops from high voltage level to low voltage level, the sixth transistor T6 is turned off, the fifth transistor T5 is turned on by the high voltage level provided and is configured to charge the first maintain-enabling terminal P1 to high voltage level. The seventh transistor T7 and the eighth transistor T8 are therefore turned on, and may respectively couple the controlling terminal Q and the signal output terminal OUT to low voltage supply $V_{SS}$, so that noise voltages at the controlling terminal Q and the signal output terminal OUT may be discharged in time, and the goal of low voltage maintaining may be achieved. It is to be noted that, since the seventh transistor T7 and the eighth transistor T8 are under DC pressure during the entire low voltage maintaining phase, after a long working time, the first maintaining unit 31 may fail due to severe shift of threshold voltage(s) of the seventh transistor T7 and/or the eight transistor T8, and make the output of the entire circuit to be wrong.

To avoid the failure of the first maintaining unit 31 due to severe shift of threshold voltage, in the shift register unit of the present embodiment, the second maintaining unit 32 and threshold voltage sensing module 40 are introduced. Threshold voltage sensing module 40 may be configured to sense the threshold voltage shift of the seventh transistor T7 and the eighth transistor T8 in the first maintaining unit 31 through the first maintain-enabling terminal P1, and may also configured to control the on/off state of the second maintaining unit 32 according to the amount of threshold voltage shift sensed. Therefore, even if the seventh transistor T7 and the eighth transistor T8 encounter great threshold voltage shift, the second maintaining unit 32 may continue to maintain the low voltage level at the controlling terminal Q and the signal output terminal OUT.

Specifically, a control electrode of the twelfth transistor T12 is coupled to the first maintain-enabling terminal P1, the control electrodes of the seventh transistor T7 and the eighth transistor T8 are also coupled to the first maintain-enabling terminal P1, and the second electrodes of the three transistors are all coupled to the low voltage supply $V_{SS}$. Therefore, it may be understood that the twelfth transistor T12 has approximately same amount of threshold voltage shift as the seventh transistor T7 and the eighth transistor T8.

As shown in FIG. 2, in the low voltage maintaining phase, when the first clock signal $V_A$ rises from low voltage level to high voltage level (for example at t4), the voltage at the second maintain-enabling terminal P2 is coupled to high voltage level rapidly due to the coupling effect of the second capacitor C2. The coupling voltage $\Delta V_{C2}$ may be expressed as:

$$\Delta V_{C2} = \frac{C_2}{C_{P2}}(V_H - V_L)$$

wherein, $C_2$ represents the capacitance value of the second capacitor $C_2$, and $C_{P2}$ represents the total capacitance value at the second maintain-enabling terminal P2, $V_H$ and $V_L$ respectively represent high and low voltage level of clock signals. Since the twelfth transistor T12 is turned on, a current path exists from the second maintain-enabling terminal P2 to $V_{SS}$. Therefore, the high voltage at the second maintain-enabling terminal P2 may drops along with time. At preliminary working stage of the shift register unit, the threshold voltages $V_{THM}$ of the seventh transistor T7, the eighth transistor T8 and the twelfth transistor T12 are relatively small, therefore the high voltage at the second maintain-enabling terminal P2 may be pulled down to $V_L$ by the twelfth transistor T12 rapidly. Therefore, the second maintain-enabling terminal P2 may not turn on the second maintaining unit 32.

As the working time of the shift register unit accumulates, the threshold voltages $V_{THM}$ of the seventh transistor T7, the eighth transistor T8 and the twelfth transistor T12 start to shift. For the twelfth transistor T12, its turning-on ability decreases as it threshold voltage increases, therefore when the voltage at the second maintain-enabling terminal P2 is coupled to high voltage level, the speed for such high voltage level to drop decreases.

Figure 3:
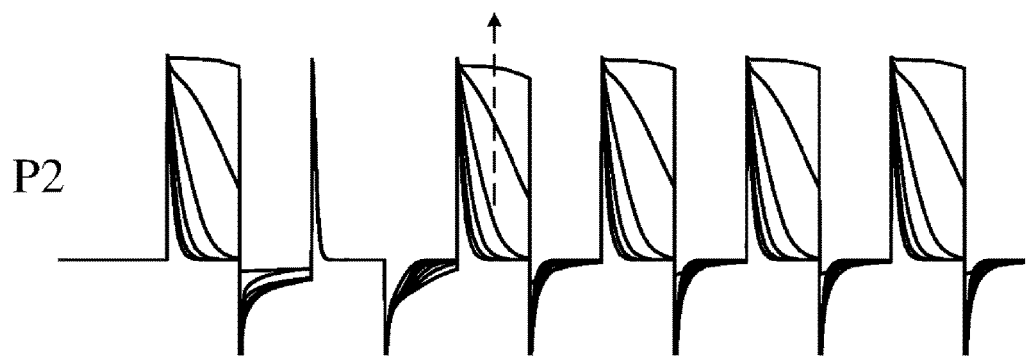
FIG. 3 illustrates a waveform diagram of a signal at a second maintain-enabling terminal P2 according to the first embodiment of the present application.

FIG. 3 is a diagram illustrates the waveform of voltage at the second maintain-enabling terminal P2 changing as $V_{THM}$ shifts. As shown in FIG. 3, along with the increase of $V_{THM}$, the shape of the waveform of the signal at the second maintain-enabling terminal P2 tends to be square pulse, as indicated by the dotted line arrow in FIG. 3. This change may gradually turn on the second maintaining unit 32 so as to maintaining the voltages as the controlling terminal Q and the output terminal OUT at low voltage level. When the signal at the second maintain-enabling terminal P2 is at high voltage level, the tenth transistor T10 and the eleventh transistor T11 are turned on, and the voltages at the controlling terminal Q and the signal output terminal OUT are pulled down to $V_L$. The function of transistor T9 is to pull the voltage at the second maintain-enabling terminal P2 to low voltage level $V_L$ when the output signal $V_{OUT}$ is at high voltage level, so that the tenth transistor T10 and the eleventh transistor T11 may be turned off, therefore influences due to the leakage of the two transistors on the self-boosting of the controlling terminal Q during the working phase of the shift register unit, as well as on the charging of the signal output terminal OUT, may be avoided.

According to the above, threshold sensing module 40 is configured to control the turning on of the second maintaining unit 32 by sensing the threshold voltage shift of the transistors in the first maintaining unit 31. Therefore, even when the amount of threshold voltage shift of the low voltage level maintaining transistors in the first maintaining unit 31 is great, the circuit can still function properly. In this case, the low voltage maintaining module may endure greater threshold voltage shift, and therefore the life span of the circuit is extended.

Embodiment II

Figure 4:
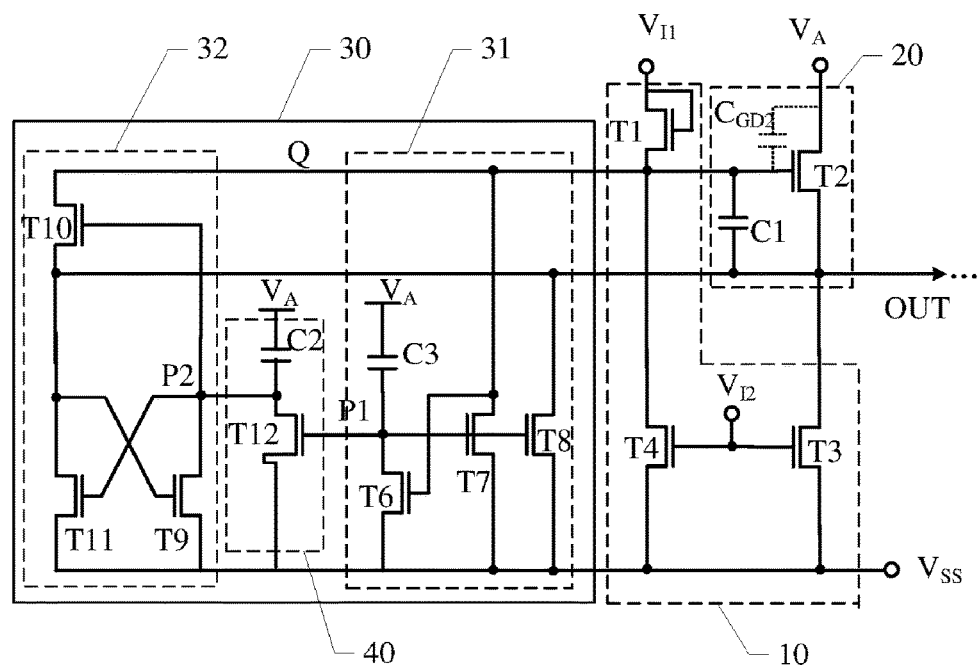
FIG. 4 illustrates a circuit structure diagram of a shift register unit according to a second embodiment of the present application.

FIG. 4 illustrates a circuit structure diagram of a shift register unit according to one embodiment of the present application. Different from the previous embodiment, the maintaining unit 32 in the present embodiment includes: a third capacitor C3, a sixth transistor T6, a seventh transistor T7, and an eighth transistor T8. A first side of the third capacitor C3 is configured to receive the first clock signal $V_A$, and a second side of the third capacitor C3 is coupled to a first electrode of the sixth transistor T6. A control electrode of the sixth transistor T6 is coupled to a first electrode of the seventh transistor T7, a second electrode of the sixth transistor T6 is coupled to low voltage supply $V_{SS}$. A first electrode of the seventh transistor T7 is coupled to the controlling terminal Q of the driving module 20, a control electrode of the seventh transistor T7 is coupled to the first electrode of the sixth transistor T6, the control electrode of the seventh transistor T7 is the first maintain-enabling terminal P1, and a second electrode of the seventh transistor T7 is coupled to low voltage supply $V_{SS}$. A first electrode of the eighth transistor T8 is coupled to the signal output terminal of the shift register unit, a control electrode of the eighth transistor T8 is coupled to the control electrode of the seventh transistor T7, and a second electrode of the eighth transistor T8 is coupled to low voltage supply $V_{SS}$.

Figure 5:
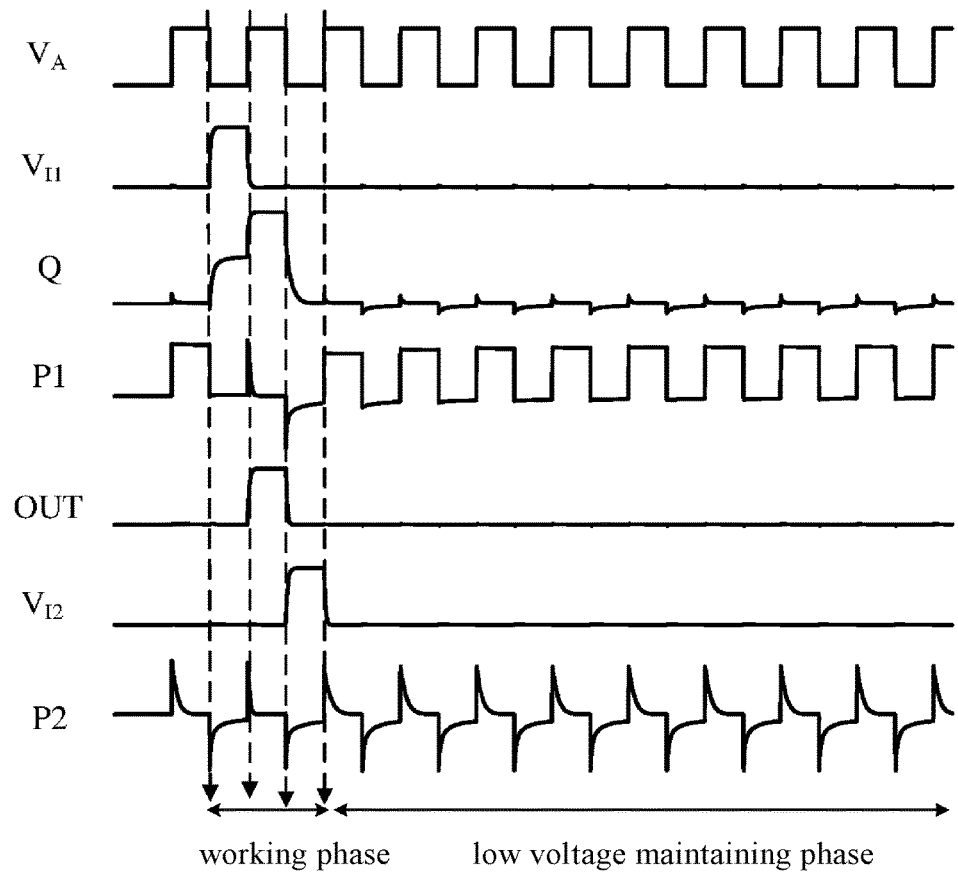
FIG. 5 illustrates a sequence diagram of the shift register unit according to the second embodiment of the present application.

FIG. 5 is a sequence diagram of the shift register unit according to the instant embodiment. The working process of the shift register unit in Embodiment II is the same as Embodiment I, except that in the low voltage maintaining phase of the shift register unit, the waveform of the signal at the first maintain-enabling terminal P1 is the pulse signal provided by the first clock signal $V_A$.

The advantage of the shift register unit in the instant embodiment is that no additional high voltage supply is required in the shift register unit, so that the number of signal lines in the circuit is reduced. Besides, in the first maintaining unit 31, the seventh transistor T7 and the eighth transistor T8 are driven by impulsive pressure, therefore the speed of threshold voltage shift is slower, rendering a long life span of the shift register unit.

Figure 6:
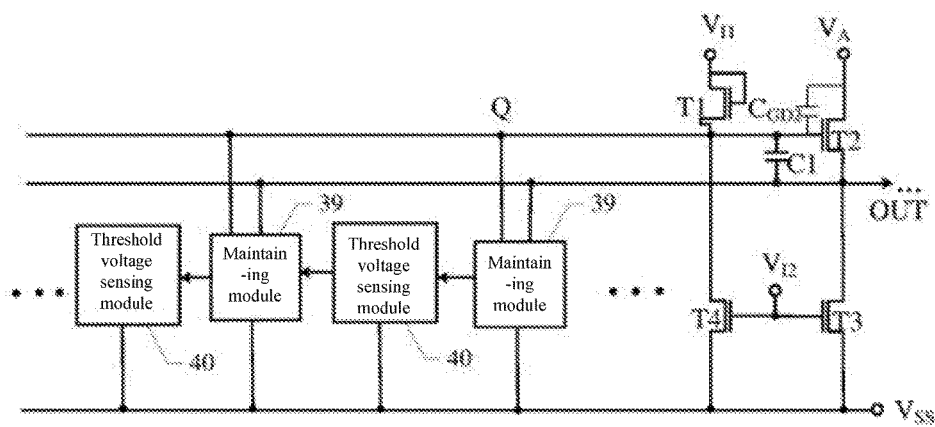
FIG. 6 illustrates a circuit structure diagram of another shift register unit according to a second embodiment of the present application.

In other embodiments, as illustrated in FIG. 6, low voltage maintaining module 30 may further include a plurality of cascaded maintaining units 39, each of which is configured to maintain the signal output terminal and/or the controlling terminal Q of driving module 20 at low voltage level when an effective level is received at its maintain-enabling terminal. A threshold voltage sensing module 40 is coupled between the adjacent maintaining units 39. A sensing terminal of the threshold voltage sensing module 40 is coupled to the maintain-enabling terminal of a previous stage maintaining unit, a signal output terminal of the threshold voltage sensing module 40 is coupled to the maintain-enabling terminal of a next stage maintaining unit. The threshold voltage sensing module 40 is configured to control its signal output terminal to provide an effective level to a next stage maintaining unit according to shifted threshold voltage sensed at its sensing terminal.

In the instant embodiment, maintaining unit 39, threshold voltage sensing module 40 may have a structure as illustrated in any of the embodiments described. The advantage of the shift register unit in the present embodiment is that each of the threshold voltage sensing modules 40 may sense the threshold voltage shift of a previous stage maintaining unit 39, and control the on/off state of a next stage maintaining unit according to the amount of threshold voltage shift sensed. Therefore, the plurality of maintaining units may work continuously. Compared with the previous embodiment, multiple maintaining units collaboratively to achieve low voltage maintain, which may further extend the life span of the circuit.

Embodiment III

Figure 7:
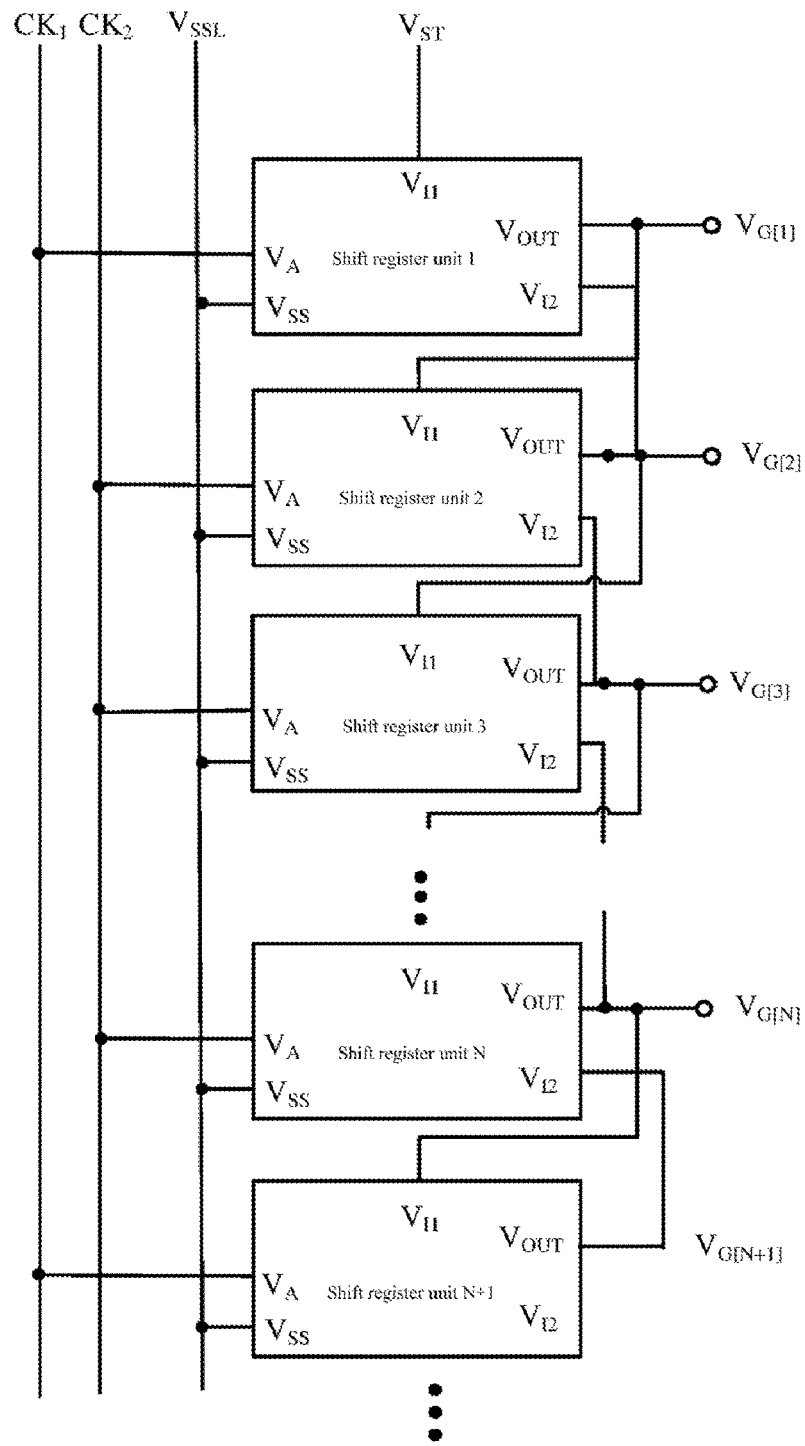
FIG. 7 illustrates a structure diagram of a shift register according to a third embodiment of the present application.

FIG. 7 is a structure diagram of a shift register according to one embodiment of the present application.

In the present embodiment, the shift register includes: a first clock line $CK_1$, a second clock lines $CK_2$, a start signal line $V_{ST}$, a common ground line $V_{SSL}$, a plurality of cascaded shift register units as described in any of the above embodiments.

The first clock line $CK_1$ and the second clock line $CK_2$ are configured to transmit two non-overlapping clock signals. The start signal line $V_{ST}$ is coupled to the first pulse signal input terminal the shift register unit of the first stage. The common ground line $V_{SSL}$ is coupled to the low voltage supply terminal $V_{SS}$ of the shift register unit at each stage, to provide a low voltage signal $V_L$ to the shift register unit at each stage.

In the present embodiment, the first clock line $CK_1$ is configured to provide the first clock signal $V_A$ to odd numbered (or even numbered) shift register units, the second clock line $CK_2$ is configured to provide the first clock signal $V_A$ to even numbered (or odd numbered) shift register units. The signal output terminal of the kth stage shift register unit is coupled to the first pulse signal input terminal of the k+1th stage shift register unit and the second pulse signal input terminal of the k−1th stage shift register unit, wherein k is a positive integer greater than 1.

Figure 8:
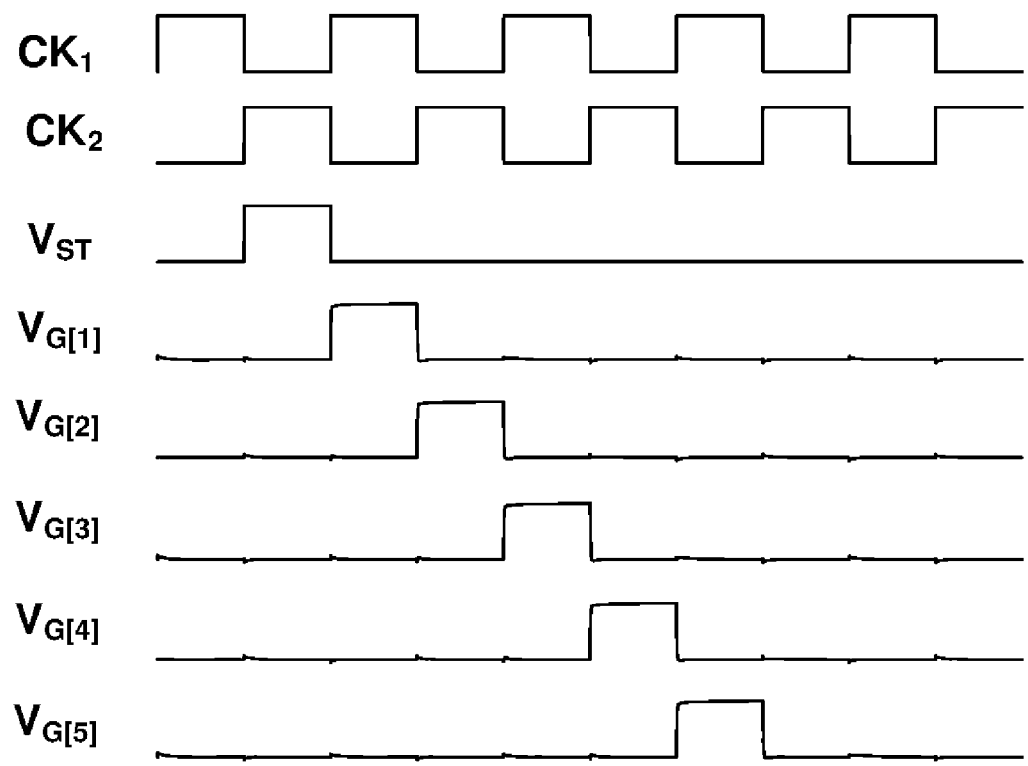
FIG. 8 illustrates a sequence diagram of the shift register according to a third embodiment of the present application.

FIG. 8 is a sequence diagram of the shift register according to the present embodiment. The signal output terminals of the 1st to the Nth stage shift register units are respectively coupled to the N gate scanning lines on the display panel. When the high voltage levels of the clock signals transmitted through the clock signal lines $CK_1$ and $CK_2$ arrive alternately, the gate scanning lines $V_{G[1]}$~$V_{G[N]}$ are configured to output high voltage pulse sequentially.

Accordingly, the advantage of the present embodiment is that:

First, longer life span;

In the present embodiment, the threshold voltage sensing module is configured to the threshold voltage shift of the previous stage maintaining unit, and to control the on/off state of the next stage maintaining unit according to the sensed threshold voltage shift. In this case, the low voltage maintaining module can endure greater threshold voltage shift and the life span of the circuit may be extended.

Second, simpler circuit structure, less signal lines.

No additional clock signals are required by the shift register provided in the present embodiment, which is helpful to stabilize the performance of the low voltage maintaining circuit.

Figure 9:
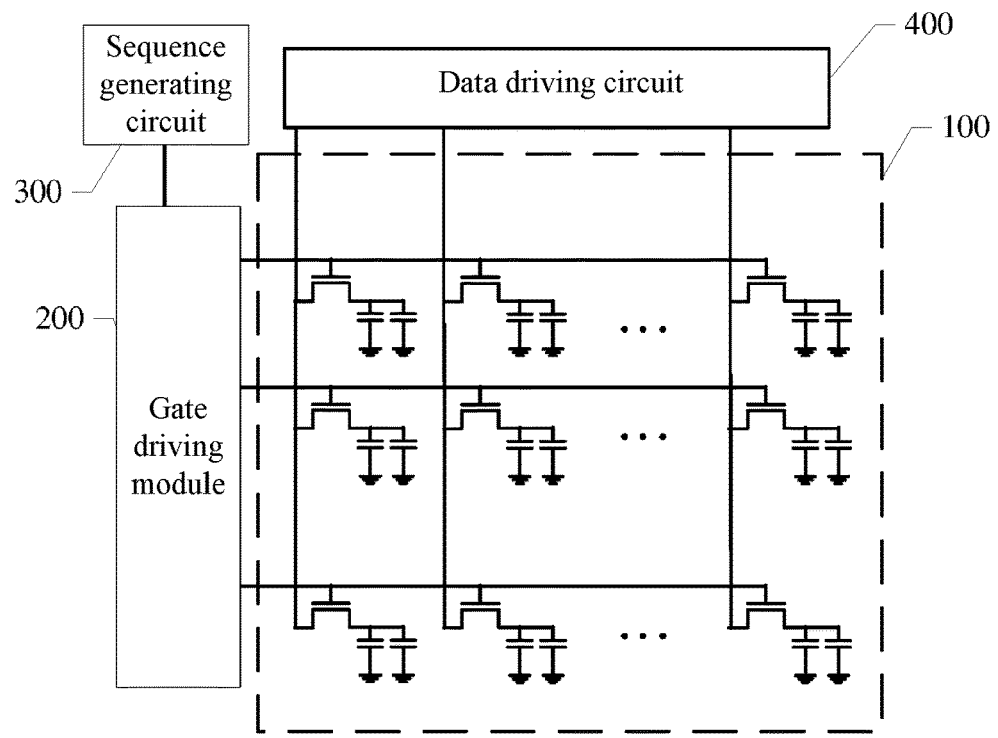
FIG. 9 illustrates a diagram of a display device according to embodiments of the present application.

The present embodiment also discloses a display device. As shown in FIG. 9, the display device includes:

a display panel 100, including a two-dimensional pixel array which includes a plurality of two dimensional pixels, a plurality of gate scanning lines connected to each of the pixels in a first direction (for example horizontal), and a plurality of data lines connected to each of the pixels in a second direction (for example vertical). Pixels of the same row in the array are coupled to the same gate scanning line, and pixels of the same column n the array are couple to the same data line. The display panel 100 may be a liquid crystal display panel, an OLED display panel, an E-paper display panel, and corresponding display device may be liquid crystal display device, an OLED display device, an E-paper display device and so forth;

a gate driving circuit 200, including a plurality of gate driving circuit unit and the gate scanning signal output terminal of which are coupled to the corresponding gate scanning lines on the display panel 100, for progressive scanning the pixel array. The gate driving circuit 200 may be coupled to the display panel 100 through welding or may be integrated in the display panel 100. The gate driving circuit 200 may include any of the shift register described herein. In one embodiment, the gate driving circuit 200 may be positioned on one side of the display panel 100, and in a preferred embodiment, a pair of gate driving circuit 200 may be adopted and may be positioned on both sides of the display panel 100;

a data driving circuit 400, configured to generate image signals, and to output such signals to the corresponding data lines on the display panel 100. The image signals are transmitted to the corresponding pixels through the data lines to achieve image gray scale;

a sequence generating circuit 300, configured to generate sequence signals required by the gate scanning circuit 200.

Embodiment IV

Figure 10:
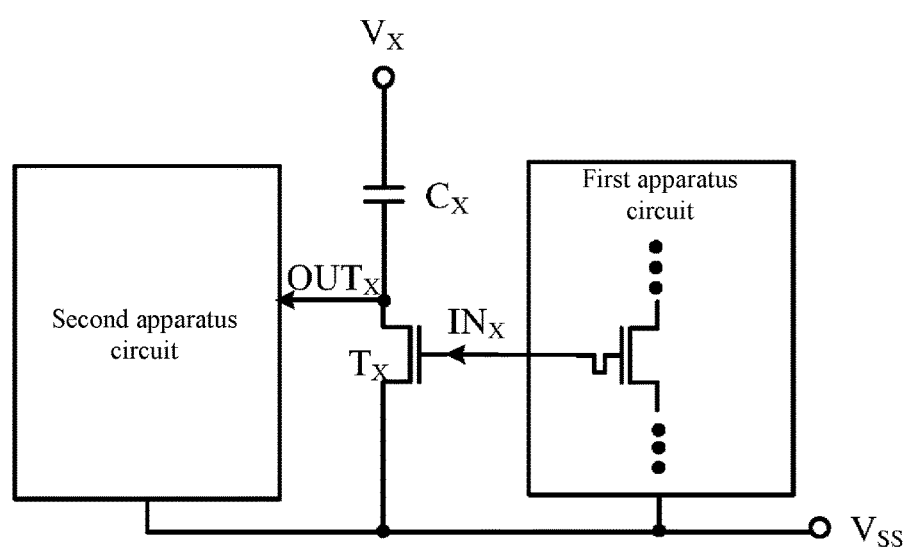
FIG. 10 illustrates a structure diagram of a voltage regulating circuit according to embodiments of the present application.

The present embodiment discloses a voltage regulating circuit, configured to regulate a supply voltage provided a second apparatus circuit according to threshold voltage information of a first apparatus circuit. As shown in FIG. 10, the voltage regulating circuit includes: a coupling capacitor $C_x$ and a sensing transistor $T_x$.

A control electrode of the sensing transistor $T_x$ is a sensing terminal $IN_x$ of the voltage regulating circuit, configured to sense threshold voltage shift of transistors to be sense in the first apparatus circuit, a second electrode of the sensing transistor $T_x$ is coupled to low voltage supply $V_{SS}$, and a first electrode of the sensing transistor $T_x$ is a signal output terminal $OUT_x$ of the voltage regulating circuit, configured to provide supply voltage to the second apparatus circuit.

A first side of the coupling capacitor $C_x$ is configured to receive clock signal $V_x$, and a second side of the coupling capacitor $C_x$ is coupled to the first electrode of the sensing transistor $T_x$.

The sensing transistor $T_x$ is configured to adjust its turning-on status according to the threshold voltage shift sensed, and to regulate the supply voltage provided to the second apparatus circuit.

The voltage regulating circuit in the present embodiment is adapted to: when sensing that the voltage of the first apparatus circuit reaches a threshold value, the voltage regulating circuit may control providing/terminating the supply voltage to the second apparatus circuit. Of course, according to the description of the embodiment, the voltage regulating circuit may also configured to control the level of the supply voltage provided to the second apparatus circuit according to the voltage sensed.

Specific embodiments are used to illustrate the present application. These embodiments are merely used to help to understand the present application and are not to be constructed as limiting the present application. Those skilled in the art can make various variations to the above specific embodiments according to the concept of the application.

What is claimed is:

1. A shift register, comprising at least one shift register unit which includes:
   driving module, configured to transmit a first clock signal to a signal output terminal of the shift register unit by switching on/off state of a controlling terminal, to output a scanning signal;
   inputting module, configured to control the on/off state of the controlling terminal of the driving module; and
   low voltage level maintaining module, including: a first maintaining unit configured to maintain a signal output terminal and/or the controlling terminal of the driving module at low voltage level when a first maintain-enabling terminal receives an effective level; a second maintaining unit, configured to maintain the signal output terminal and/or the controlling terminal of the driving module at low voltage level when a second maintain-enabling terminal receives an effective level;
   wherein, the shift register unit further includes:
   threshold voltage sensing module, having a sensing input terminal coupled to the first maintain-enabling terminal and a signal output terminal coupled to the second maintain-enabling terminal, configured to control its signal output terminal to provide an effective level to the second maintain-enabling terminal according to shifted threshold voltage sensed at its sensing input terminal.

2. The shift register according to claim 1, wherein
   the low voltage level maintaining module includes a plurality of cascaded maintaining units, and each of the maintaining units is configured to maintain the signal terminal and/or the controlling terminal of the driving module at low voltage level when an effective level is received at its maintain-enabling terminal;
   threshold voltage sensing modules are coupled in series between respective stages of maintaining units, the sensing input terminals of the threshold voltage sensing modules are coupled to the maintain-enabling terminals of the maintaining unit of a previous stage, the signal output terminals of the threshold voltage sensing modules are coupled to the maintain-enabling terminals of a next stage; the threshold voltage sensing modules are configured to control their signal output terminals to provide an effective level to the maintain-enabling terminals of the next stage maintaining units according to the shifted threshold voltages sensed at its sensing input terminals.

3. The shift register according to claim 1, wherein the threshold voltage sensing module comprises: a twelfth transistor and a second capacitor;
  a control electrode of the twelfth transistor is the sensing input terminal of the threshold voltage sensing module, a second electrode of the twelfth transistor is coupled to low voltage supply, a first electrode of the twelfth transistor is coupled to a first side of the second capacitor forming the signal output terminal of the threshold voltage sensing module, a second side of the second capacitor is configured to receive the first clock signal.

4. The shift register according to claim 1, wherein the first maintaining unit comprises: a fifth transistor, a sixth transistor, a seventh transistor and an eighth transistor;
  a control electrode of the fifth transistor is coupled to its first electrode which is coupled to high voltage supply, a second electrode of the fifth transistor is coupled to a first electrode of the sixth transistor;
  a control electrode of the sixth transistor is coupled to a first electrode of the seventh transistor, and a second electrode of the sixth transistor is coupled to low voltage supply;
  a first electrode of the eight transistor is coupled to the signal output terminal of the shift register unit, a control electrode of the eighth transistor is coupled to the control electrode of the seventh transistor, and a second electrode of the eighth transistor is coupled to low voltage supply.

5. The shift register according to claim 1, wherein the first maintaining unit comprises: a third capacitor, a sixth transistor, a seventh transistor and an eighth transistor;
  a first side of the third transistor is configured to receive the first clock signal, and a second side of the third transistor is coupled to a first electrode of the sixth transistor;
  a control electrode of the sixth transistor is coupled to a first electrode of the seventh transistor, and a second electrode of the sixth transistor is coupled to low voltage supply;
  the first electrode of the seventh transistor is coupled to the controlling terminal of the driving module, and a control electrode of the seventh transistor is coupled to a first electrode of the sixth transistor, the control electrode of the seventh transistor is the first maintain-enabling terminal, and a second electrode of the seventh transistor is coupled to low voltage supply;
  a first electrode of the eighth transistor is coupled to the controlling terminal of the driving module, a control electrode of the eighth transistor is coupled to the control electrode the seventh transistor, and a second electrode of the eighth transistor is coupled to low voltage supply.

6. The shift register according to claim 1, wherein the second maintaining unit comprises: a ninth transistor, a tenth transistor, and an eleventh transistor;
  a control electrode of the ninth transistor is coupled to a second electrode the tenth transistor, a first electrode of the ninth transistor is coupled to a control electrode of the tenth transistor, a second electrode of the ninth transistor is coupled to low voltage supply;
  a first electrode the tenth transistor is coupled to the controlling terminal of the driving module, the second electrode the tenth transistor is coupled to a first electrode of the eleventh transistor, the control electrode of the tenth transistor is the second maintain-enabling terminal;
  a control electrode of the eleventh transistor is coupled to the control electrode the tenth transistor, a first electrode of the eleventh transistor is coupled to the signal output terminal of the shift register unit, a second electrode of the eleventh transistor is coupled to low voltage supply.

7. The shift register according to claim 1, wherein the driving module comprises a second transistor and a first capacitor;
  a control electrode of the second transistor is coupled to a first side of the first capacitor forming the controlling terminal of the driving module, a second electrode of the second transistor is coupled to a second side of the first capacitor forming the signal output terminal of the shift register unit, a first electrode of the second transistor is configured to receive the first clock signal.

8. The shift register according to claim 1, wherein the inputting module comprises: a first transistor, a third transistor and a fourth transistor;
  a control electrode of the first transistor is coupled to its first electrode configured to receive a first pulse signal, a second electrode of the first transistor is coupled to the controlling terminal of the driving module;
  a control electrode of the fourth transistor and a control electrode of the third transistor are configured to receive a second pulse signal, a first electrode of the fourth transistor is coupled to the controlling terminal of the driving module, and a second electrode of the fourth transistor is coupled to low voltage supply;
  a first electrode of the third transistor is coupled to the signal output terminal of the shift register unit, and a second electrode is coupled to low voltage supply;
  an effective level of the first pulse signal is half clock cycle ahead of that of the first clock signal, and an effective level of the second pulse signal is half clock cycle behind that of the first clock signal.

9. A display device, including a two-dimensional pixel array that includes a plurality of pixels, and a plurality of data lines along a first direction and a plurality of gate scanning lines along a second direction coupled to each of the pixels in the pixel array;
  data driving circuit, configured to provide data signals to the data lines; and
  gate driving circuit, configured to provide gate driving signals to the gate scanning lines;
  wherein the gate driving circuit includes the shift register of claim 1.

* * * * *